United States Patent [19]

Suyama et al.

[11] Patent Number: 4,769,822

[45] Date of Patent: Sep. 6, 1988

[54] SEMICONDUCTOR LASER DEVICE

[75] Inventors: Takahiro Suyama; Kohsei Takahashi, both of Tenri; Saburo Yamamoto; Toshiro Hayakawa, both of Nara; Masafumi Kondo, Tenri, all of Japan

[73] Assignee: Sharp Kabushiki Kaisha, Osaka, Japan

[21] Appl. No.: 910,530

[22] Filed: Sep. 23, 1986

[30] Foreign Application Priority Data

Sep. 26, 1985 [JP]  Japan ................. 60-213519

[51] Int. Cl.⁴ ............................................. H01S 3/19
[52] U.S. Cl. .................................... 372/46; 372/45; 372/96; 357/17
[58] Field of Search ............ 372/44, 45, 46, 96; 357/17

[56] References Cited

U.S. PATENT DOCUMENTS 4,190,813  2/1980  Logan et al. .................... 372/96
4,509,173  4/1985  Umeda et al. .................. 372/45
4,594,718  6/1986  Scifres et al. ................... 372/45

FOREIGN PATENT DOCUMENTS 0196089  11/1983  Japan ............................. 372/45

*Primary Examiner*—James W. Davie
*Assistant Examiner*—Georgia Y. Epps
*Attorney, Agent, or Firm*—Ciotti & Murashige, Irell & Manella

[57] ABSTRACT

A semiconductor laser device comprising a laser oscillation-operating area containing a first cladding layer, an active layer, an optical guiding layer and a second cladding layer in that order, wherein a striped impurity-diffusion region is formed into said second cladding layer from one facet to the other facet and a plurality of narrow strips of GaAs with a spaced pitch are formed in parallel with both facets in the region, except for the region corresponding to said striped diffusion region, which is positioned at the interface between the optical guiding layer and the second cladding layer.

4 Claims, 2 Drawing Sheets

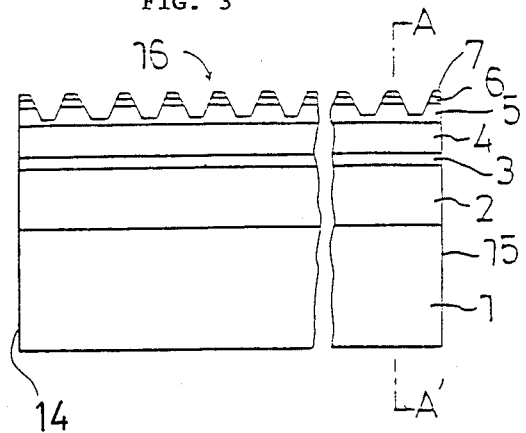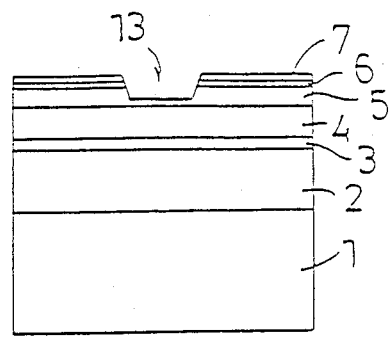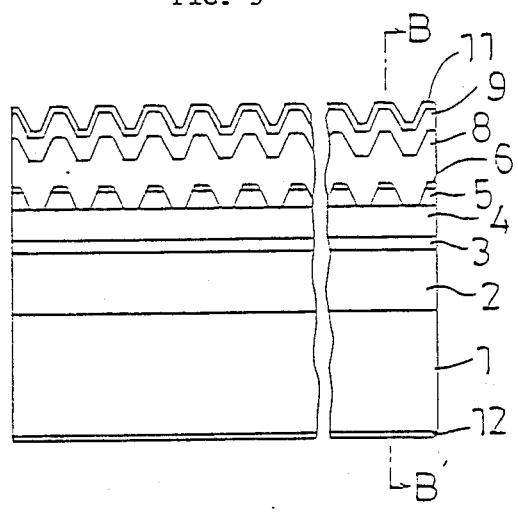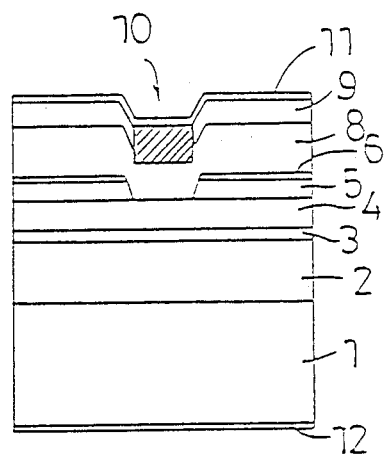

SEMICONDUCTOR LASER DEVICE

BACKGROUND OF THE INVENTION

1. Field of the invention:

This invention relates to a semiconductor laser device which can be produced using molecular beam epitaxy or metal organic-chemical vapor deposition and which can attain laser oscillation not only in a stable longitudinal mode but also in a stable transverse mode.

2. Description of the prior art:

In recent years, semiconductor laser devices have been widely used in compact disc players, video disc players, optical disc files, etc. In order to obtain stable optical characteristics of these apparatuses, semiconductor laser devices having an index guided structure are used. Due to the index guided structure, the transverse mode attained by the semiconductor laser devices is stabilized to a great extent, and the above-mentioned apparatuses incorporating the semiconductor laser devices therein exhibit fine performance and excellent stability.

Semiconductor laser devices to be applied to other apparatuses such as laser beam printers and various measuring machines are required to oscillate laser light not only in a stable transverse mode but also in a stable longitudinal mode. However, significantly stabilized laser oscillation cannot be attained by the index guided structure alone.

On the other hand, in order to stabilize laser oscillation in a longitudinal mode, distributed feedback (DFB) semiconductor lasers and distributed Bragg reflection (DBR) semiconductor lasers have been proposed. However, these semiconductor laser devices are inferior in that when GaAs/GaAlAs materials are employed, the surface of the crystal region containing Al tends to be oxidized, which causes difficulties in the succeeding growth of a crystal on the GaAlAs layer forming a diffraction grating. Therefore, these proposed semiconductor laser devices have not been successful in practical use.

SUMMARY OF THE INVENTION

The semiconductor laser device of this invention, which overcomes the above-discussed and numerous other disadvantages and deficiencies of the prior art, comprises a laser oscillation-operating area containing a first cladding layer, an active layer, an optical guiding layer and a second cladding layer in that order, wherein a striped impurity-diffusion region is formed into said second cladding layer from one facet to the other facet and a plurality of narrow strips of GaAs with a spaced pitch are formed in parallel with both facets in the region, except for the region corresponding to said striped diffusion region, which is positioned at the interface between the optical guiding layer and the second cladding layer.

The crystal layers are, in a preferred embodiment, grown by molecular beam epitaxy or metal-organic chemical vapor deposition.

The active layer is, in a preferred embodiment, of a single layered structure or a multiquantum well structure.

Thus, the invention described herein makes possible the objects of (1) providing a semiconductor laser device which attains laser oscillation not only in a stable transverse mode but also in a stable longitudinal mode; (2) providing a semiconductor laser device which exhibits excellent characteristics in the region of an oscillation wavelength of about 800 nm; and (3) providing a semiconductor laser device which can be readily produced.

BRIEF DESCRIPTION OF THE DRAWINGS

This invention may be better understood and its numerous objects and advantages will become apparent to those skilled in the art by reference to the accompanying drawings as follows:

FIGS. 2, 3 and 5 are diagrams showing a process for the production of the semiconductor laser device shown in FIG. 1.

FIG. 4 is a side sectional view on line A—A' in FIG. 3.

FIG. 6 is a side sectional view on line B—B' in FIG. 5.

DESCRIPTION OF THE PREFERRED EMBODIMENTS

Figure 1:
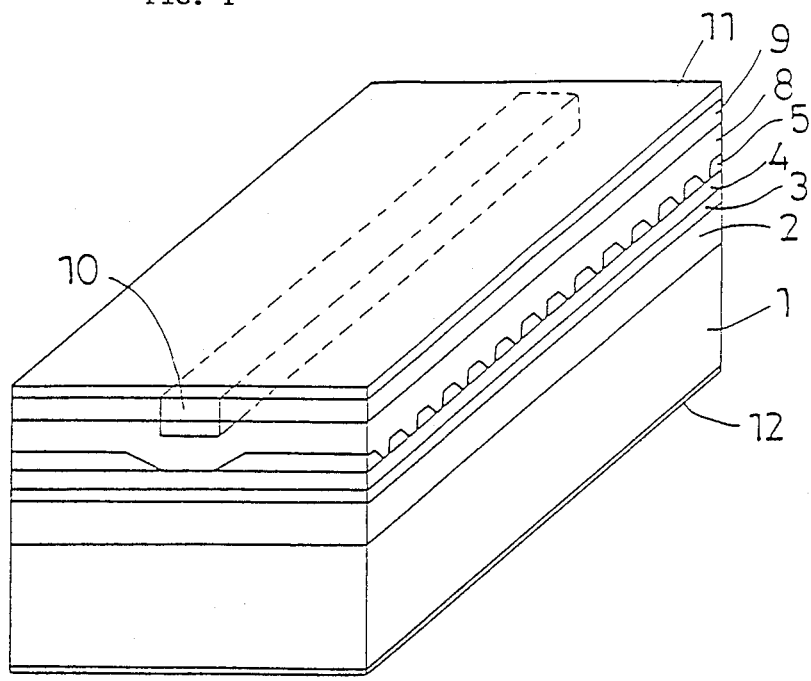
FIG. 1 is a perspective view showing a semiconductor laser device of this invention.

FIG. 1 shows a semiconductor laser device of this invention which comprises a GaAs substrate 1, a first cladding layer 2, an active layer 3, an optical guiding layer 4, an n-GaAs layer 5, a second cladding layer 8 and an electrode layer 9 in that order. A striped Zn-diffusion region 10 is disposed in the second cladding layer 8 through the electrode layer 9 from one facet to the other facet. The n-GaAs layer 5 forms a plurality of narrow strips in parallel with the facets in the region (except for the region corresponding to the striped Zn-diffusion region 10) which is positioned at the interface between the optical guiding layer 4 and the second cladding layer 8. On the upper face of the electrode layer 9 and the back face of the substrate 1, a p-sided electrode 11 and an n-sided electrode 12 are disposed, respectively.

Figure 2:
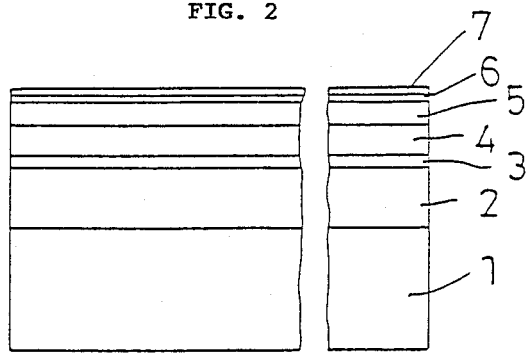

This semiconductor laser device is produced as follows: As shown in FIG. 2, on an n-GaAs substrate 1, an n-Ga$_{0.65}$Al$_{0.35}$As first cladding layer 2 having a thickness of 1.5 μm, a Ga$_{0.93}$Al$_{0.07}$As active layer 3 having a thickness of 700 Å, a p-Ga$_{0.75}$Al$_{0.25}$As optical guiding layer 4 having a thickness of 1000 Å, an n-GaAs layer 5 having a thickness of 1500 Å, an n-Ga$_{0.8}$Al$_{0.2}$As evaporation-protective layer 6 having a thickness of 50 Å and an n-GaAs oxidation-protective layer 7 having a thickness of 50 Å are successively grown by molecular beam epitaxy. Then, the resulting wafer is taken out of a molecular beam epitaxial growth apparatus (not shown) and, as shown in FIGS. 3 and 4, a striped channel 13 having a width of 2 μm for defining the light-emitting region is formed into the n-GaAs layer 5 through both the n-GaAs oxidation-protective layer 7 and the n-Ga$_{0.8}$Al$_{0.2}$As evaporation-protective layer 6 from one facet 14 to the other facet 15 by photolithography. At the same time, a corrugation structure 16 composed of a plurality of narrow strips of GaAs with a spaced pitch of, for example, 3400 Å which functions as a diffraction grating is formed into the n-GaAs layer 5 through both the n-GaAs oxidation-protective layer 7 and the n-Ga$_{0.8}$Al$_{0.2}$As evaporation-protective layer 6 by photolithography in a manner to be parallel with the facets 14 and 15. In order to prevent the oxidation of the surface of the p-Ga$_{0.75}$Al$_{0.25}$As optical guiding layer 4 in the succeeding crystal growth process, the bottom area of the corrugation structure 16 constituted by the n-GaAs layer 5 is retained with a thickness of about 100–500 Å.

Then, the resulting wafer is again placed in the molecular beam epitaxial growth apparatus, and the substrate 1 is heated, while the wafer is irradiated with an arsenic molecular beam, to evaporate the whole area of the n-GaAs oxidation-protective layer 7 and the bottom area of the n-GaAs layer 5 of the corrugation structure 16. Due to the n-$Ga_{0.8}Al_{0.2}As$ evaporation-protective layer 6, the area of the n-GaAs layer 5 underlying said evaporation-protective layer 6 is not evaporated. Then, as shown in FIGS. 5 and 6, on the evaporation-protective layer 5 containing the striped channel 13 and the corrugation structure 16, a p-$Ga_{0.65}Al_{0.35}As$ second cladding layer 8 and an n-GaAs electrode layer 9 are successively grown by molecular beam epitaxy. The resulting wafer is then taken out of the molecular beam epitaxial growth apparatus. A striped Zn-diffusion region 10 is then formed in the p-$Ga_{0.65}Al_{0.35}As$ second cladding layer 8 through the n-GaAs electrode layer 9 at the area corresponding to the striped channel 13, followed by the formation of a p-sided electrode 11 and an n-sided electrode 12 on the upper face of the n-GaAs electrode layer 9 and the back face of the n-GaAs substrate 1, respectively, resulting in a semiconductor laser device.

This semiconductor laser device attained laser oscillation at a threshold current of 130 mA. The n-GaAs layer 5 constituting a diffraction grating absorbs light in a fundamental transverse mode to a slight extent and absorbs light in a high-order transverse mode to a great extent, so that laser oscillation could be achieved in an extremely stable fundamental transverse mode. Moreover, due to the diffraction grating constituted by the n-GaAs layer 5, the longitudinal mode attained by this laser device was extremely stable. Laser oscillation was achieved in a single longitudinal mode with a wavelength of 811 nm up to an output power of 5 mW. When the driving current was fixed at 200 mA, mode-hopping was not observed at a temperature in the range of 15° C. to 45° C. and laser oscillation was stably attained in a single longitudinal mode. This indicates that the laser device can attain laser oscillation not only in a stable transverse mode but also in a stable longitudinal mode without the occurrence of mode-hopping regardless of changes in atmospheric temperature.

Since this invention requires molecular beam epitaxy or metal-organic chemical vapor deposition as a crystal growth technique, a multi-quantum well structure can be used as an active layer, which allows for further improvement of the device characteristics.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a laser oscillation-operating area containing a first cladding layer, an active layer, an optical guiding layer and a second cladding layer in that order, the device wherein a striped impurity-diffusion region is formed into said second cladding layer from one facet to the other facet and a plurality of narrow strips of GaAs with a spaced pitch are formed in parallel with both facets and positioned at the interface between said optical guiding layer and said second cladding layer, where said GaAs strips are absent beneath said striped diffusion region.

2. A semiconductor laser device according to claim 1, wherein said crystal layers are grown by molecular beam epitaxy or metal-organic chemical vapor deposition.

3. A semicondcutor laser device according to claim 1, wherein said active layer is of a single layered structure or a multi-quantum well structure.

4. A semiconductor laser device according to claim 2, wherein said active layer is of a single layered structure or a multi-quantum well structure.

* * * * *